United States Patent [19]

Hornbeck

[11] Patent Number: 5,099,353
[45] Date of Patent: Mar. 24, 1992

[54] ARCHITECTURE AND PROCESS FOR INTEGRATING DMD WITH CONTROL CIRCUIT SUBSTRATES

[75] Inventor: Larry J. Hornbeck, Van Alstyne, Tex.

[73] Assignee: Texas Instruments Incorporated, Dallas, Tex.

[21] Appl. No.: 637,892

[22] Filed: Jan. 4, 1991

Related U.S. Application Data

[62] Division of Ser. No. 546,331, Jun. 29, 1990, Pat. No. 5,018,256.

[51] Int. Cl.⁵ .............................................. G02B 26/00
[52] U.S. Cl. ..................................... 359/291; 359/295
[58] Field of Search ................. 350/360; 359/291, 295

[56] References Cited

U.S. PATENT DOCUMENTS

| | | | |
|---|---|---|---|
| 3,746,785 | 7/1973 | Goodrich | 350/360 |
| 3,924,228 | 12/1975 | Goodrich | 350/360 |
| 4,248,504 | 2/1981 | Albertinetti et al. | 350/360 |
| 4,441,791 | 4/1984 | Hornbeck | 350/360 |
| 4,592,628 | 6/1986 | Altman et al. | 350/360 |
| 4,660,938 | 4/1987 | Kazan | 350/360 |
| 4,909,611 | 3/1990 | Spooner | 350/360 |

Primary Examiner—Eugene R. Laroche
Assistant Examiner—Evelyn Lester
Attorney, Agent, or Firm—Richard A. Stoltz; Rene E. Grossman; Richard L. Donaldson

[57] ABSTRACT

DMD projection light values for HDTV have various manufacturing requirements, including the high yield integration of the DMD superstructure on top of an underlying CMOS address circuit. The CMOS chip surface contains several processing artifacts that can lead to reduced yield for the DMD superstructure. A modified DMD architecture and process are disclosed that minimizes the yield losses caused by these CMOS artifacts while also reducing parasitic coupling of the high voltage reset pulses to the underlying CMOS address circuitry.

6 Claims, 3 Drawing Sheets

ARCHITECTURE AND PROCESS FOR INTEGRATING DMD WITH CONTROL CIRCUIT SUBSTRATES

This is a division, of application Ser. No. 546,331, filed June 29, 1990, now U.S. Pat. No. 5,018,256 issued 05/28/91.

TECHNICAL FIELD OF THE INVENTION

This invention relates to deformable mirror devices and more particularly to a system for forming such devices in conjunction with control circuit substrates.

RELATED APPLICATION AND PATENTS

All of the following patent applications are cross-referenced to one another, and all have been assigned to Texas Instruments Incorporated. These applications have been concurrently filed and are hereby incorporated in this patent application by reference.

Multi-Level Deformable Mirror Device, Ser. No. 546,465, filed on June 29, 1990, now U.S. Pat. No. 5,083,857, issued on Jan. 28, 1992;

Improved Bistable DMD Addressing Circuit and Method Ser. No. 546,271, filed on June 29, 1990;

Field Updated Deformable Mirror Device, Ser. No. 546,332, filed on June 29, 1990;

Also referenced herein and incorporated by reference is:

Spatial Light Modulator and Method, Ser. No. 355,049, filed May 15, 1989, gone abandoned on Sept. 13, 1990;

Spatial Light Modulator and Method, Ser. No. 408,355, filed Sept. 14, 1989, gone abandoned on Nov. 26, 1990;

U.S. Pat. No. 4,662,756 Spatial Light Modulator and Method Dated May 5, 1987;

U.S. Pat. No. 4,566,935 Spatial Light Modulator and Method Dated Jan. 28, 1986; and U.S. Pat. No. 4,615,595 Frame Addressed Spatial Light Modulator Dated Oct. 7, 1986

BACKGROUND OF THE INVENTION

Bistable deformable mirror devices (DMDs) are the subject of the above-listed copending U.S. patent application entitled "Spatial Light Modulator" (Ser. No. 355,049) There are many uses for such devices, such as, for example, as a projection light valve for high-definition television (HDTV). For such a system, DMD pixel arrays as large as 1.8 megapixels are required, addressed by an underlying CMOS address circuit.

In order to minimize development costs and maximize chip yields, it is important to choose a well established, production tested CMOS technology. High volume CMOS wafer fabricators are reluctant to customize their CMOS process for ar user's application. For this reason, it is necessary that the DMD superstructure place no special requirements on the CMOS process.

Unfortunately, there are several process artifacts in the CMOS multi-level metalization process that can cause yield losses in the DMD superstructure. These artifacts include aluminum hillocks, pinholes in the protective oxide, a nonplanar chip surface and protective oxide contacts with a steep sidewall angle.

An example of a DMD is shown in above-listed patent application, Ser. No. 355,049 entitled "Spatial Light Modulator" filed May 15, 1989. As shown in the aforementioned application, the DMD device has a beam reflective surface which is deformed, or pivoted, into contact with a landing pad or electrode under control of voltages selectively applied either by the beam or to a control electrode or to both.

Aluminum hillocks can cause weak spots in the overlying protective oxide, leading to dielectric breakdown when high voltage reset pulses, which are necessary with DMD system arrays, are applied to the overlying landing electrodes.

An additional problem is that the hillocks are replicated by the electrode metal and when hillocks are under the DMD address control electrodes, the DMD torsion beam can land on these hillocks, causing the address electrodes to be shorted to the beam. When hillocks are under the landing electrode, the beam is prevented from rotating to the full deflection angle, thereby reducing the light-to-dark effect of the deforming beam.

In addition, pinholes in the protective oxide cause shorts between the electrode metal and the final CMOS metalization layer, thereby further reducing the yield of good devices and also reducing their life expectancy.

The final CMOS metalization layer containing the electrical circuits is not planarized and it produces steps in the protective oxide which can lead to residual filaments when the electrode metal is etched with an anisotropic plasma etch. Thus, filaments cause shorts between neighboring electrodes.

Finally, the protective oxide contacts in a standard CMOS process are not etched with sloped sidewalls, but rather tend to be nearly vertical. This can lead to poor step coverage of the electrode metal down into the contacts.

A need therefore exists in the art for a DMD device which is constructed integral with a CMOS substrate without being effected by the typical CMOS artifacts.

SUMMARY OF THE INVENTION

A modified DMD superstructure architecture that eliminates the effects of CMOS artifacts has been devised consisting of a planarizing organic first spacer (typically 0.5 μm thick) spun over the CMOS address circuit prior to the electrode metal deposition. Contact openings and electrode support post holes are patterned in this first spacer which is then deep UV hardened to a temperature 10° to 20° C. hotter than the hardening temperature for the next level spacer which is typically 180° C. The first spacer is hardened to give slightly tapered sidewalls to the contacts and support posts for good metal step coverage.

The conventional DMD process consists of the following steps: First the electrode metal is deposited and patterned followed by the deposition of the second spacer and patterning of support post holes. Then the hinge and beam metal patterns are formed by deposition and patterning of metal layers on the surface of the second spacer. Finally, the air gaps under the deflectable beam elements are formed by a plasma undercut. During the plasma undercut of the beams, the first spacer and the second beam or support spacer are removed. The plasma undercut forms an air gap between the electrode and the underlying CMOS address circuit. The electrode is supported by the contacts and electrode support posts.

The effect of the spacer on the CMOS process artifacts is that the gaps between leads of the final CMOS metalization layers are planarized. Hillocks are planarized and air gap isolation is provided over the weakened overlying protective oxide. Air gap isolation is also provided over pinholes in the protective oxide. Finally, the steep oxide sidewalls of the protective oxide contacts are replaced by the sloped contacts of the spacer.

There are additional benefits to the modified DMD superstructure architecture. Because the landing electrodes are air isolated from the address circuit, there is reduced parasitic coupling of the fast rise-time, high-voltage reset pulse train to the underlying address circuit. This coupling, if uncontrolled, can produce voltage spikes on the gates of the address transistors, causing the transistors to momentarily turn on at the wrong time.

Finally, because the address electrodes are air isolated, they have reduced capacitance. It is therefore possible with this modified DMD superstructure architecture to build a frame-addressed DMD where the address electrode rather than the beam is charge-addressed.

One technical advantage of adding a spacer layer in the manner described is that the new architecture minimizes the yield loss caused by CMOS process artifacts, reduces parasitic coupling between the DMD and CMOS and provides an alternate architecture for the charge-addressed DMD.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
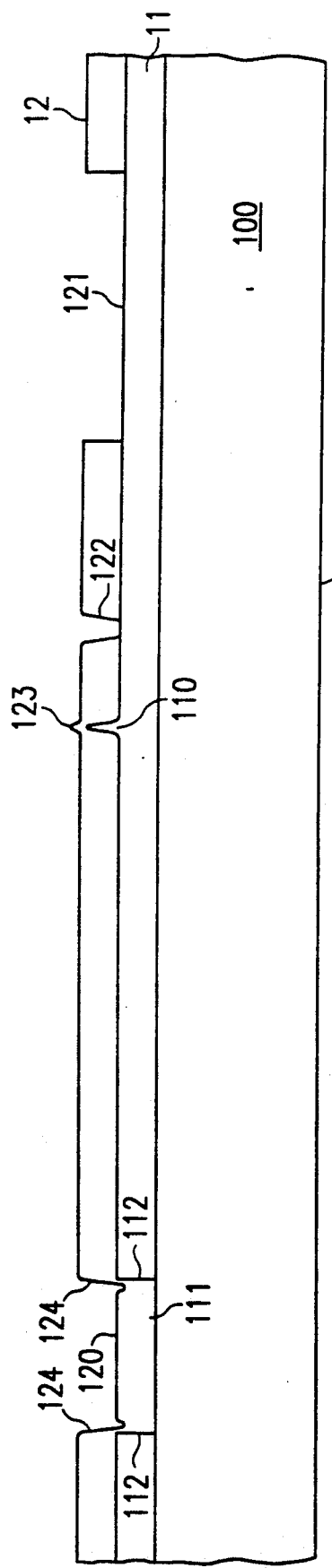
FIG. 1 is a substrate showing CMOS artifacts.

FIG. 1 illustrates how typical CMOS process artifacts can lead to reduced DMD superstructure yields. These artifacts include aluminum hillocks 110, pinholes 122 in the protective oxide, nonplanar chip surface and protective oxide contacts with steep sidewalls 112.

Figure 2:
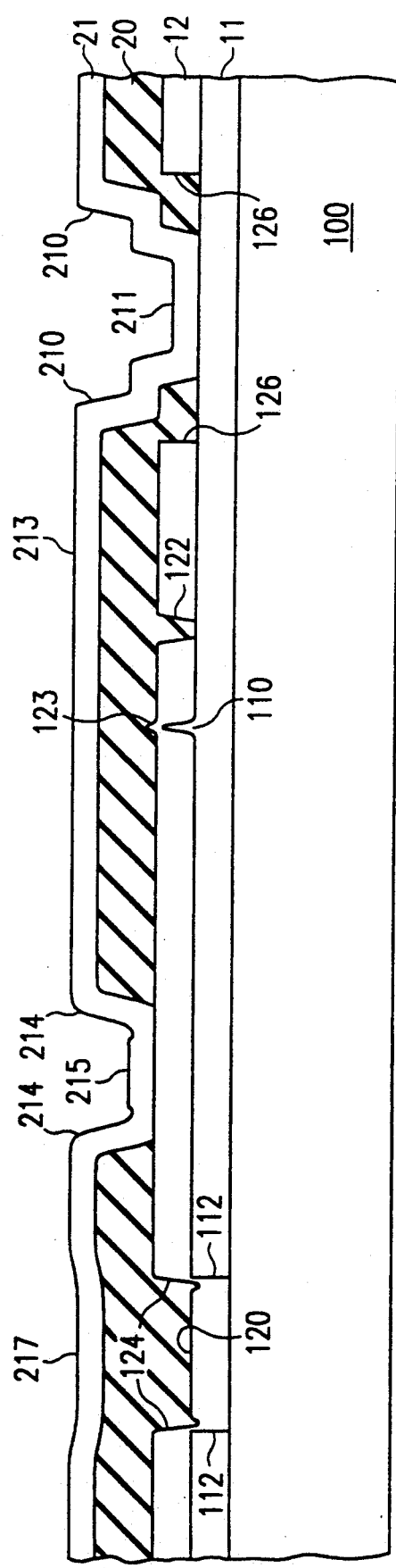
FIG. 2 is a substrate with a spacer added to remove the effect of the CMOS artifacts and showing overlying electrodes.

A modified DMD superstructure architecture that eliminates these artifacts is shown in FIG. 2. It consists of a planarizing organic spacer 20 (typically 0.5 $\mu$m thick) spun over the CMOS address structure 100, 11 and 12 prior to the electrode metal deposition. This spacer is distinguished from the conventional DMD spacer formed between the electrode and beam. Contact openings 211 and electrode support post holes 215 are patterned in spacer 20 and the spacer is deep UV hardened to a temperature 10° to 20° C. hotter than the hardening temperature for the DMD spacer which is typically 180° C. The hardening program is chosen to give slightly tapered sidewalls 210, 214 to the contacts 211 and support posts 215 for good metal step coverage.

Gaps 112 between leads of the final CMOS metalization layers are planarized 217. Hillocks 110 are planarized and air gap isolation is provided over the weakened overlying protective oxide. Air gap isolation is also provided over pinholes 122 in the protective oxide. Finally, the steep oxide sidewalls 126 of the protective oxide contacts 211 are replaced by the sloped contacts 210 of spacer 20. The electrode metal 21 is deposited and patterned after the deposition of spacer 20.

There are additional benefits to the modified DMD superstructure architecture. Because the landing electrodes are air isolated from the address circuit, there is reduced parasitic coupling of the fast rise-time, high-voltage reset pulse train to the underlying address circuit. This coupling, if uncontrolled, can produce voltage spikes on the gates of the address transistors, causing the transistors to momentarily turn on at the wrong time.

Finally, because the address electrodes are air isolated, they have reduced capacitance. It is therefore possible with this modified DMD superstructure architecture to build a frame-addressed DMD (U.S. Pat. No. 4,615,595) where the address electrode rather than the beam is charge-addressed.

In summary, this new architecture minimizes the yield loss caused by CMOS process artifacts, reduces parasitic coupling between the DMD and CMOS and provides an alternate architecture for the charge-addressed DMD.

Figure 3:
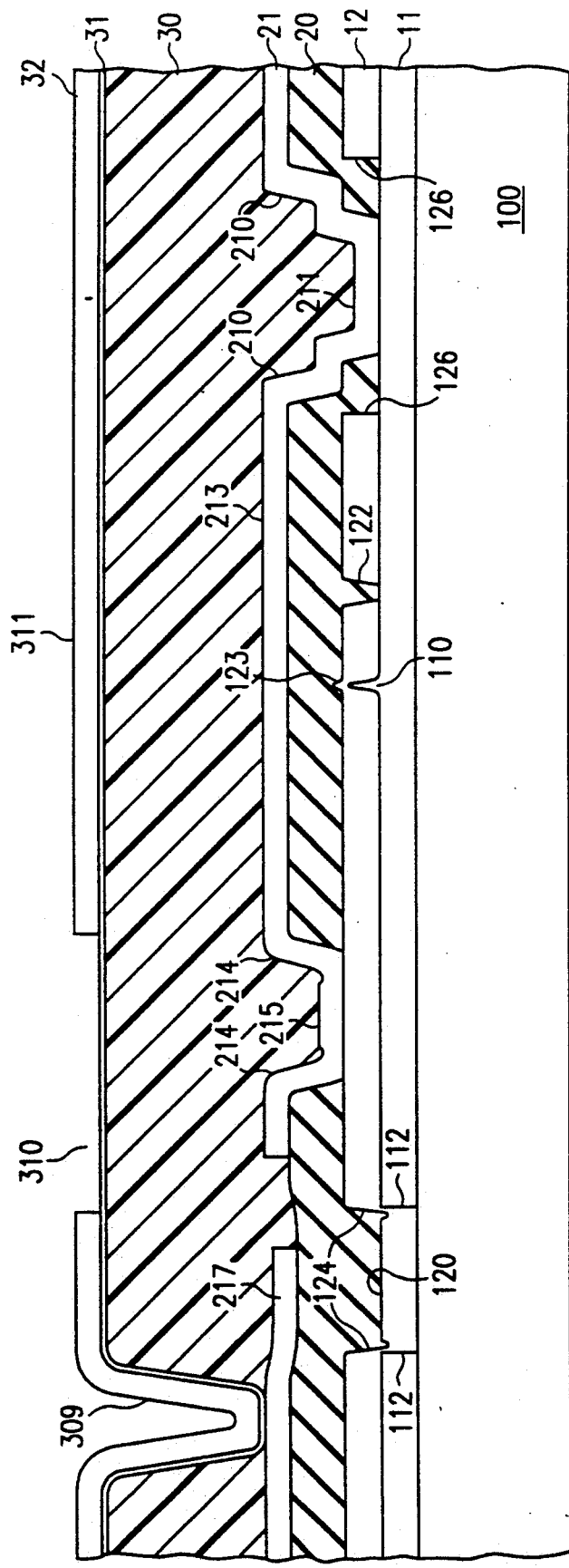
FIG. 3 is the completed structure before the spacers are removed.

Then as shown in FIG. 3, spacer 30 is spin-deposited over the electrodes and patterned with holes that will form beam support posts 309. Spacer 30 determines the torsion beam angular deflection and is typically 2.3 microns thick and is a positive photoresistant. It is deep UV hardened to a temperature of 180° C. to prevent flow and bubbling during subsequent processing steps. Note that no degradation of spacer 20 occurs during this bake because spacer 20 was hardened to a higher temperature (200° C.). Finally, thin hinges 310 and thick beams 311 are formed on spacer 30 by a deposition and patterning process shown in the aforementioned U.S. Pat. No. 4,662,746.

Figure 4:
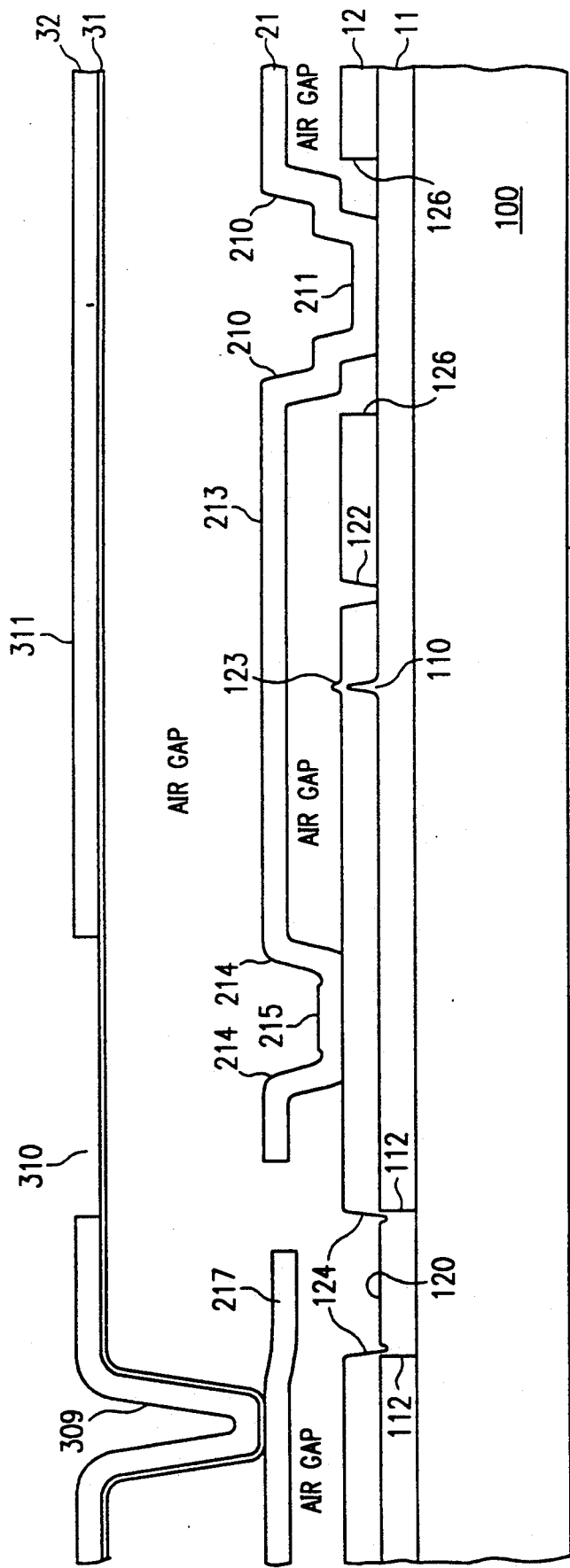
FIG. 4 is the completed structure with the spacers removed.

This completes the process at the wafer level. The wafers are then coated with PMMA, sawed into individual chips and pulse spin-cleaned with chlorobenzene. Finally, the chips are placed in a plasma etching chamber where both spacer layers 20 and 30 are completely removed to form the air gaps under the hinges and beams as shown in FIG. 4.

Although this description describes the invention with reference to the above specified embodiments, the claims and not this description limits the scope of the invention. Various modifications of the disclosed embodiment, as well as alternative embodiments of the invention, will become apparent to persons skilled in the art upon reference to the above description. Therefore, the appended claims will cover such modifications that fall within the true scope of the invention.

What is claimed is:

1. A device having an electrostatically deflectable element, said device comprising:

a) a substrate;

b) first support posts having a fixed relationship with said substrate;

c) at least one electrode supported by said first support posts and spaced from said substrate;

d) second support posts having a fixed relationship with said substrate; and e) at least one deflectable mechanical element supported by said second support posts and spaced from said electrode, whereby said mechanical element moves relative to said substrate in response to an electrostatic signal supplied to said electrode and said spacing significantly reduces the effects of said substrate defects on said electrode.

2. The device set forth in claim 1 wherein said substrate is a CMOS substrate having a traditional oxide or nitride protective top coating.

3. The device as set forth in claim 1, wherein said spacing between said substrate and said electrode is an air gap.

4. The device set forth in claim 2, wherein said mechanical element is a DMD.

5. The device set forth in claim 4, wherein said DMD comprises:
 a) at least one hinge; and
 b) at least one deflective beam.

6. The device set forth in claim 1, wherein said substrate comprises at least one integrated circuit.

* * * * *